US006794312B2

(12) United States Patent
Abdul-Hak et al.

(10) Patent No.: US 6,794,312 B2
(45) Date of Patent: Sep. 21, 2004

(54) LAYERING NITRIDED OXIDE ON A SILICON SUBSTRATE

(75) Inventors: Ayad Abdul-Hak, Dresden (DE); Thomas Gaertner, Freital (DE); Joerg Schulze, Ottendorf-Okrilla (DE)

(73) Assignee: Infineon Technologies AG, Munich (DE)

(*) Notice: Subject to any disclaimer, the term of this patent is extended or adjusted under 35 U.S.C. 154(b) by 61 days.

(21) Appl. No.: 10/193,730

(22) Filed: Jul. 11, 2002

(65) Prior Publication Data

US 2003/0032307 A1 Feb. 13, 2003

(30) Foreign Application Priority Data

Jul. 11, 2001 (DE) .......................................... 101 33 537

(51) Int. Cl.[7] ...................... H01L 21/469; H01L 23/58
(52) U.S. Cl. ...................... 438/769; 438/786; 257/649
(58) Field of Search ....................... 257/411, 632–649, 257/701; 438/760–762, 783–792

(56) References Cited

U.S. PATENT DOCUMENTS

| 5,198,392 A | 3/1993 | Fukuda et al. ............... 437/241 |
| 5,394,420 A | 2/1995 | Senn et al. ..................... 372/39 |
| 5,851,892 A * | 12/1998 | Lojek et al. ................. 438/305 |
| 5,891,809 A | 4/1999 | Chau et al. .................. 438/770 |
| 6,215,146 B1 | 4/2001 | Umeda et al. ............... 257/315 |
| 6,541,394 B1 * | 4/2003 | Chen et al. .................. 438/770 |

FOREIGN PATENT DOCUMENTS

| DE | 195 01 388 A1 | 8/1995 | ............. H01S/3/16 |
| DE | 198 32 271 A1 | 7/1999 | ........... H01L/29/78 |

OTHER PUBLICATIONS

Gross et al. "An optimized 850°C Low–Pressure–Fernace Reoxidized Nitrided Oxide (ROXNOX) Process." *IEEE Trans. Electron Devices,* 1991, vol. 38, No.9. S. 2036–2041.

Lai et al. "Electrical Properties of Nitrided–Oxide Systems for Use in Gate Dielectrics and Eeprom". In: *IEDM International Electron Devices Meeting Technical Digest,* NY, USA, IEEE, 1983, S. 190–193.

Widman et al. "Technolgie hochintegrierter Schaltungen" 2. Auflage, Springer, Berlin, 1996, S. 20–29.

Yang et al. "Optimization of Low–Pressure Nitridation/Reoxidation of $SiO_2$ for Scaled MOS Devices," *IEEE Trans. Electronic Devices,* 1998, vol. 35, No. 7, S. 935–944.

Ma et al., "Electrical Characterization and Stimulation of Substrate Current in n–MOSFETs with Nitrided Oxides as Gates Dielectrics". *Inc: Solid–State Electronics,* 1992, vol. 35, No. 10, S. 1433–1439.

* cited by examiner

*Primary Examiner*—Caridad Everhart
*Assistant Examiner*—Calvin Lee
(74) *Attorney, Agent, or Firm*—Fish & Richardson P.C.

(57) ABSTRACT

A process for producing a nitrided oxide layer on a silicon semiconductor substrate includes introducing a multiplicity of wafers into an atmospheric batch furnace, carrying out an oxidation step at a first predetermined temperature, carrying out a nitriding step at a second predetermined temperature, and carrying out a reoxidation step at a third predetermined temperature. The wafers are then cooled and removed from the atmospheric batch furnace.

2 Claims, 4 Drawing Sheets

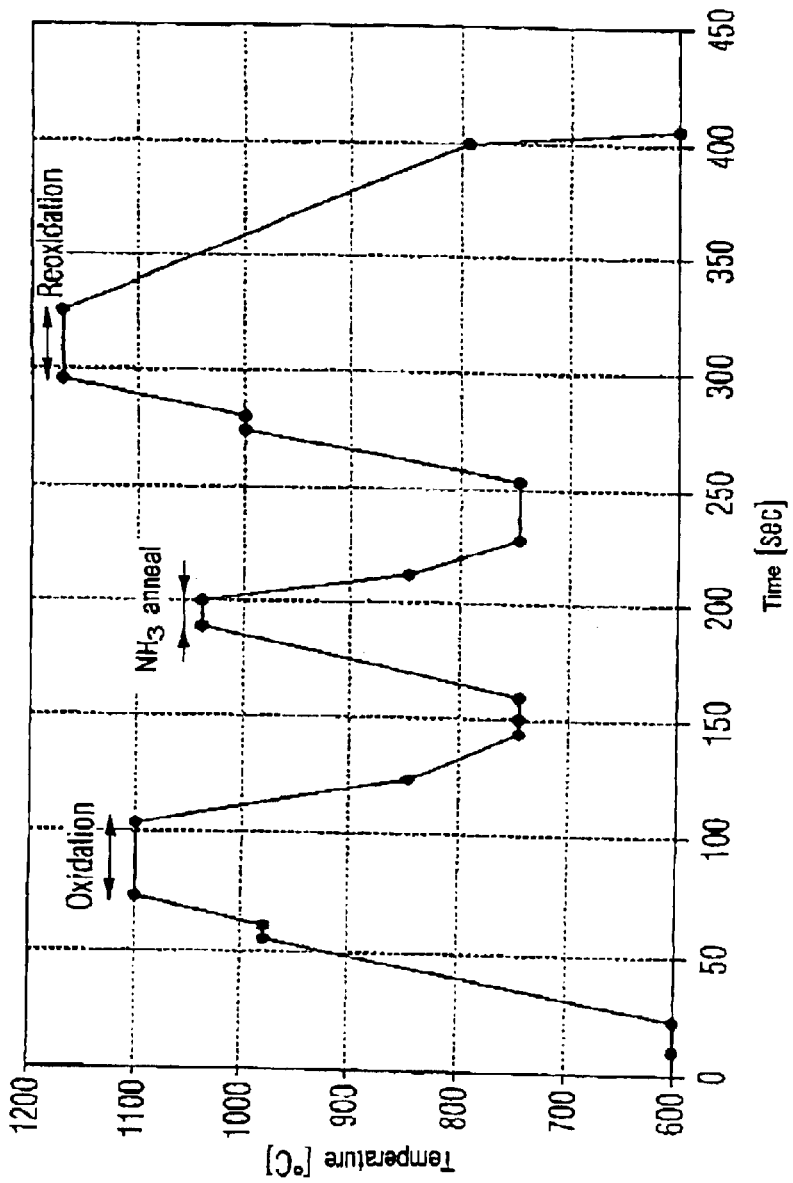

LAYERING NITRIDED OXIDE ON A SILICON SUBSTRATE

RELATED APPLICATIONS

This application claims the benefit of the Jul. 11, 2001 priority date of German application 101 33 537.7, the contents of which are herein incorporated by reference.

FIELD OF INVENTION

The present invention relates to a process for producing a nitrided oxide layer on a silicon semiconductor substrate.

BACKGROUND

Although it can in principle be applied to any desired oxides, the present invention and the problem on which it is based are explained with reference to tunnel oxides in integrated DRAM circuits used in silicon technology.

To produce nitrided tunnel oxide, for example for flash memory components, the defined inclusion of nitrogen close to the silicon/silicon oxide interface is necessary, in order to satisfy the demands imposed with regard to long oxide functionality (frequent tunneling, very numerous write/erase cycles).

Furthermore, as part of the ongoing miniaturization of these integrated circuits, it is necessary to maintain a low thermal budget of this process, in order to keep the outdiffusion of the dopants which have already been introduced by this stage of this processing at a low level.

For a narrow yield distribution at a high level, in particular the uniformity of the oxide thickness and of the inclusion of nitrogen are important.

FIG. 3 shows a diagrammatic illustration of a semiconductor substrate with a nitrided tunnel oxide in order to illustrate the problem on which the present invention is based.

In FIG. 3, 1 denotes a silicon semiconductor substrate, 10 denotes a first active region, 20 denotes a second active region, 15 denotes a channel region between them, 30 denotes a nitrided tunnel oxide lying above the channel region 15 and 40 denotes a standard gate stack, which includes, for example, a floating gate and a control gate.

The region A is illustrated separately on an enlarged scale. In this enlarged illustration, G denotes the interface between the silicon semiconductor substrate 1 and the nitrided tunnel oxide 30. The defined inclusion of nitrogen in the crystal lattice of the silicon dioxide is clearly visible.

FIG. 4 shows an example of a temperature curve for a standard RTP process used to produce a nitrided tunnel oxide.

In the example shown, the nitriding takes place by means of $NH_3$, with the result that it is possible to produce tunnel oxides with a particularly high cycle stability of typically $10^6$ write/erase cycles. The RTP process requires lamp heating in the individual wafer process, in which the individual silicon wafers are brought to the appropriate process temperature and are successively oxidized, nitrided and reoxidized using fluctuating temperatures and gas flows. The reoxidation process is used in particular to remove hydrogen.

The productivity of such a process is very low, since the processing of a single wafer lasts a few minutes. To achieve viable process results at least within this time, very high process temperatures are required, which leads to a high temperature-time load on the process wafers. Since the processed wafer and the process chamber are not in thermodynamic equilibrium throughout the entire process, the temperature distribution over the wafer can only be monitored and optimized with considerable technical outlay. Further problematical properties of the RTP process are mechanical stresses which it induces and which emanate from a temperature gradient caused by the lamp heating.

In the present example, the oxidation takes place at a temperature of 1100° C. over a time period of 60 seconds. This is followed by cooling to 750° C. and renewed heating to 1040° C., at which temperature an $NH_3$ anneal is carried out for 20 seconds. After further cooling to 750° C., reoxidation takes place at 1170° C. for a period of 60 seconds. In the process shown in FIG. 4, the total process time is approx. 400 seconds. However, as has been stated, each wafer is processed individually, which entails a considerable time outlay for the production of an entire batch of approximately 100 to 150 wafers.

In further known processes, instead of $NH_3$ NO or $N_2O$ is used in an RTP process. Nitriding in an atmospheric oxidation furnace using NO or $N_2O$ and/or nitriding in an LPCVD furnace using $NH_3$ as nitriding gas are also possible.

U.S. Pat. No. 6,204,125 B1 has disclosed a process for forming a nitrided tunnel oxide, in which an oxide layer is formed on a tunnel region of the substrate, then a nitride layer is formed on the oxide layer in an LPCVD process, and then a reoxidation process is carried out and finally the nitride layer is removed.

U.S. Pat. No. 5,258,333 has disclosed a process for producing a nitrided tunnel oxide, in which a silicon surface lying above a channel region is firstly nitrided, then an oxide layer is formed on the nitrided silicon surface, and next the oxide layer and the nitrided silicon surface are oxidized in order to form a combined dielectric layer. In this process, in particular the nitriding takes place by means of a thermal process in pure ammonia ($NH_3$).

SUMMARY

Therefore, it is an object of the present invention to provide an improved process for producing a nitrided oxide layer on a silicon semiconductor substrate which ensures a uniform oxide thickness and inclusion of nitrogen and requires a low thermal budget.

The idea on which the present invention is based consists in the use of $NH_3$ as nitriding gas in an atmospheric batch furnace which is simultaneously used for oxidation and for reoxidation.

Compared to the known approach, the production process according to the invention has the advantage, inter alia, that it is possible to improve the uniformity of the inclusion of nitrogen compared to conventional processes. Consequently, the subsequent reoxidation likewise leads to an improved uniformity of the overall oxide thickness, since the oxide growth is decisively dependent on the degree of nitriding.

According to a preferred development, the nitriding step takes place in an $NH_3$ atmosphere at a temperature of approximately 850–950° C.

According to a further preferred development, the oxidation step takes place at a temperature of approximately 800–900° C.

According to a further preferred development, the reoxidation step takes place at a temperature of approximately 900–1000° C.

According to a further preferred development, the first predetermined temperature is lower than the second predetermined temperature, and the second predetermined temperature is lower than the third predetermined temperature, and no cooling is carried out between the temperatures.

Exemplary embodiments of the invention are illustrated in the drawings and explained in more detail in the description which follows. In the drawings:

BRIEF DESCRIPTION OF THE DRAWINGS

FIG. 4 shows an example of a temperature curve for a standard RTP process used to produce a nitrided tunnel oxide.

Throughout the figures, identical reference symbols denote identical or functionally equivalent components.

DETAILED DESCRIPTION

Figure 1:
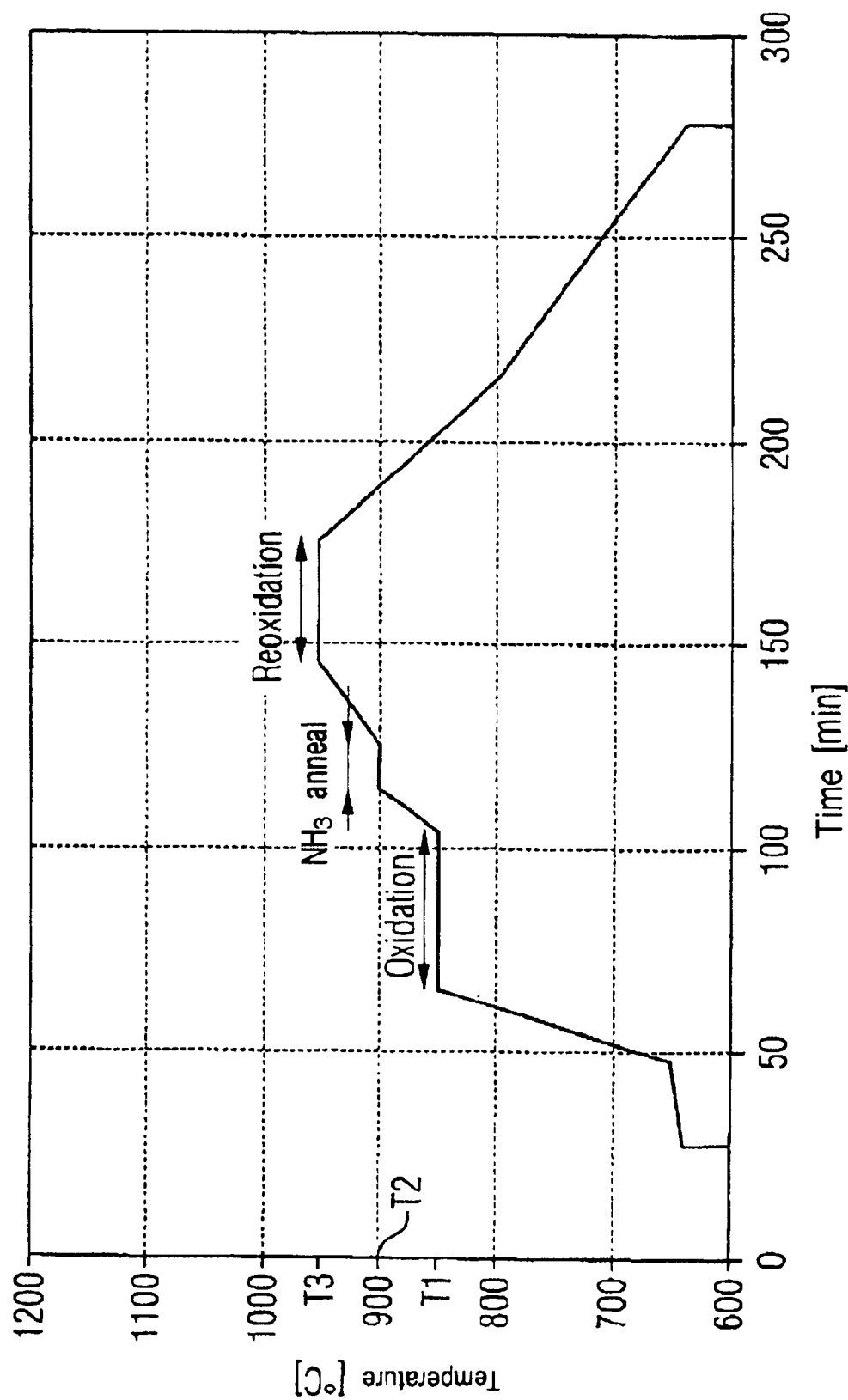
FIG. 1 shows a temperature curve of an exemplary embodiment of the process according to the invention for the production of nitrided tunnel oxide.

FIG. 1 shows a temperature curve of an exemplary embodiment of the process according to the invention for producing a nitrided tunnel oxide.

The present embodiment is carried out using a multiplicity of wafers in what is known as an atmospheric batch furnace. First of all, the temperature is increased to a first temperature plateau at a first temperature T1 of approximately 850° C., at which an oxidation step is carried out for approximately 30 minutes. Then, the temperature is increased further to a second temperature plateau at a second temperature T2 of approximately 900° C., at which an $NH_3$ anneal takes place for approximately 10 minutes. A further temperature increase leads to a third temperature plateau at a third temperature T3 of approximately 950° C., at which reoxidation is carried out for approximately 30 minutes.

Unlike in the known processes, all the wafers are in thermal equilibrium during the main process steps of oxidation, $NH_3$ nitriding and reoxidation, with the result that the thickness and composite of the layer produced are more uniform than in the known RTP process, which in turn leads to a considerable improvement in the yield stability. The use of an atmospheric batch furnace of this type typically allows 150–200 wafers to be processed simultaneously, and consequently a higher throughput can be achieved despite an increase in the overall process time from 400 seconds to approximately 300 minutes.

Typical thickness ranges for the nitrided tunnel oxides are between 6.5 nm and 15 nm.

Figure 2:
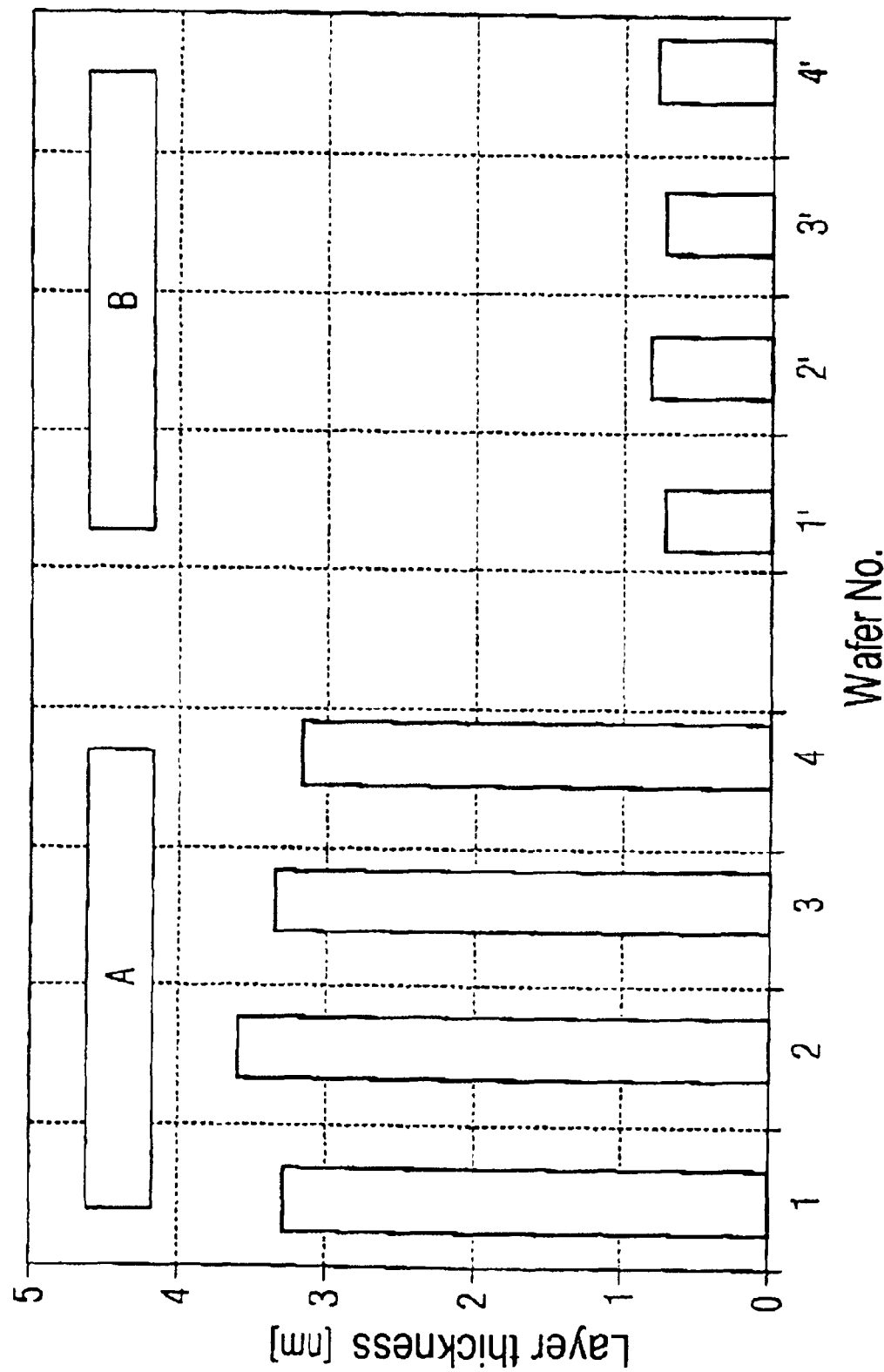
FIG. 2 shows layer thickness range distributions for nitrided tunnel oxide which has been produced by means of an RTP process (A) and for nitrided tunnel oxide which has been produced using $NH_3$ in a batch furnace in accordance with the above embodiment (B)
Figure 3:
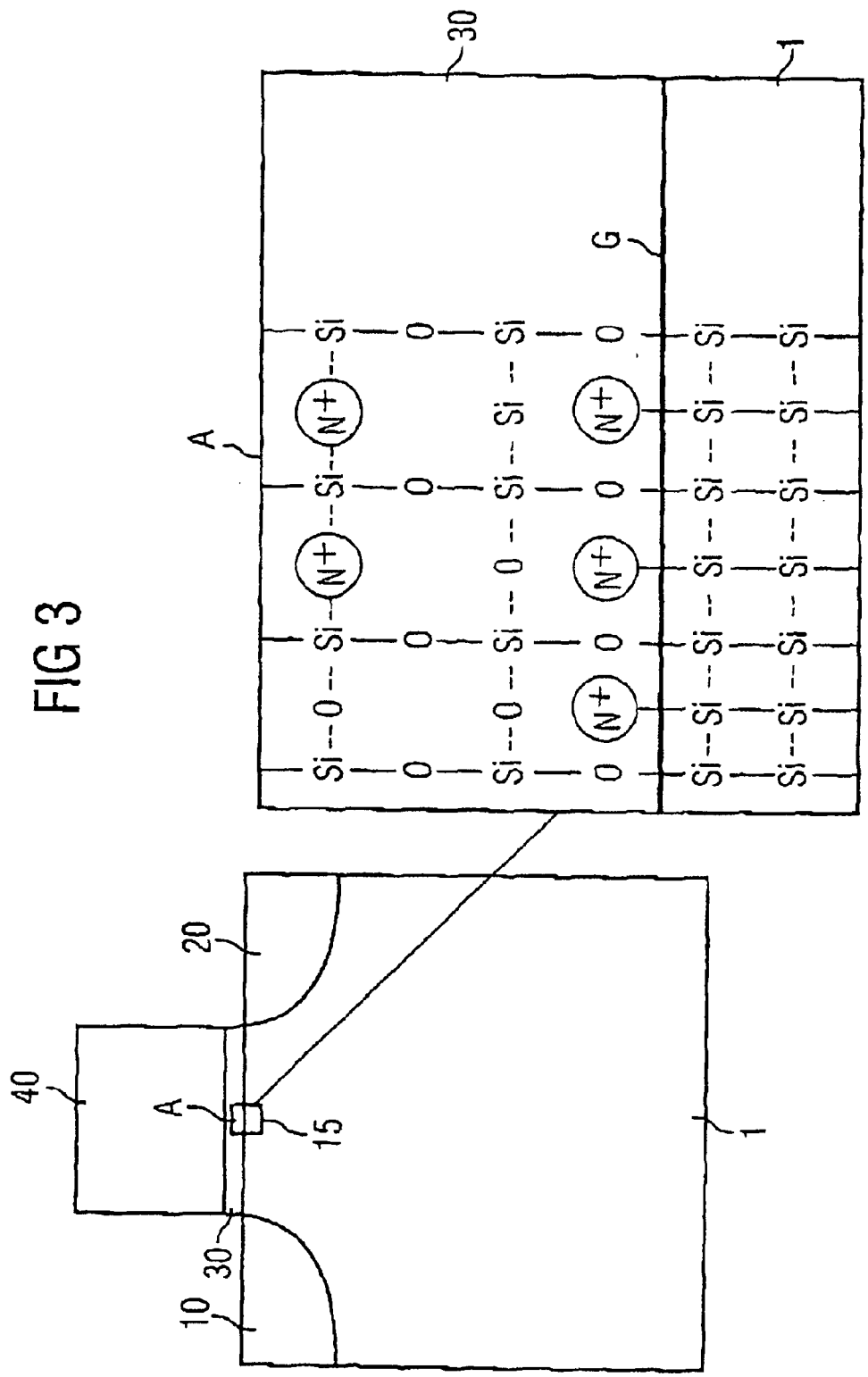
FIG. 3 diagrammatically depicts a semiconductor structure with a nitrided tunnel oxide in order to illustrate the problem on which the present invention is based.

FIG. 2 shows layer thickness range distributions (in %) for nitrided tunnel oxide which has been produced using an RTP process (A) and for nitrided tunnel oxide which has been produced using $NH_3$ in a batch furnace in accordance with the above embodiment (B).

It is clearly apparent that in the conventional process the wafers, which are denoted by 1 to 4, all have a layer thickness distribution which is approximately four times as great as a corresponding layer thickness distribution of the wafers 1' to 4' in the embodiment of the inventive process which has been explained above.

Although the present invention has been described above with reference to preferred exemplary embodiments, it is not restricted thereto, but rather can be modified in numerous ways.

In particular, the present embodiment can be applied not only to nitrided tunnel oxides but also to other nitrided oxides, for example to nitrided logic gate oxides which lie, for example, in the thickness range of 0.8 nm to 5 nm.

What is claimed is:

1. A process for producing a nitrided oxide layer on a silicon semiconductor substrate, the method comprising the steps of:

a) introducing a plurality of wafers into an atmospheric batch furnace;

b) carrying out an oxidation step at a first predetermined temperature;

c) carrying out a nitriding step at a second predetermined temperature;

d) carrying out a reoxidation step at a third predetermined temperature; and e) cooling and removing the wafers from the atmospheric batch furnace; wherein said oxidation step b) takes place at a temperature of 830–870° C.: said nitriding step c) takes place in one of an $NH_3$ and an $NH_3/N_2$ atmosphere at a temperature of 880–920° C.: said reoxidation step d) takes place at a temperature of 930–970° C.: and between steps b), c), and d) no cooling is carried out.

2. The process according to claim 1, further comprising monotonically increasing the temperature between the first and second predetermined temperatures, and monotonically increasing the temperature between the second and third predetermined temperatures.

* * * * *